United States Patent [19]

Marshall et al.

[11] Patent Number: 4,843,617
[45] Date of Patent: Jun. 27, 1989

[54] APPARATUS AND METHOD FOR SYNCHRONIZING A COMMUNICATION SYSTEM

[75] Inventors: Scott Marshall, Stittsville; Thanh Tran, Ottawa; A. David Milton, Kanata, all of Canada

[73] Assignee: Mitel Corporation, Kanata, Canada

[21] Appl. No.: 127,700

[22] Filed: Dec. 2, 1987

[30] Foreign Application Priority Data

Dec. 15, 1986 [CA] Canada ................................. 525389

[51] Int. Cl.$^4$ ............................................. H04L 7/00
[52] U.S. Cl. .................................... 375/118; 375/110; 375/111
[58] Field of Search ............... 375/106, 107, 111, 119, 375/118, 110; 340/825.2

[56] References Cited

U.S. PATENT DOCUMENTS 4,404,675  9/1983  Karcheuski ...................... 375/116 X Primary Examiner—A. D. Pellinen
Assistant Examiner—Derek S. Jennings
Attorney, Agent, or Firm—Alan H. Levine

[57] ABSTRACT

Apparatus and method for synchronizing a local clock signal with a remote clock signal. The local clock signal is divided by a digital counter for generating a phase increment signal. The phase increment signal and the remote clock signal are applied to a further digital counter for counting the number of phase increment signal cycles received during a predetermined number of cycles of the received remote clock signal and generating a count value in response thereto. A microprocessor performs a table look-up for retrieving a predetermined digital correction value using an address characterized by the count value. The correction value is applied to a digital-to-analog converter for generating an analog control voltage in response thereto. The analog control voltage is applied to a master voltage control oscillator for generating the local oscillator signal such that the local oscillator signal frequency is adjusted to be synchronized with the remote clock signal in both phase and frequency. The apparatus comprises low cost circuitry and consumes very little circuit board area and power.

18 Claims, 1 Drawing Sheet

APPARATUS AND METHOD FOR SYNCHRONIZING A COMMUNICATION SYSTEM

FIELD OF THE INVENTION

This invention relates in general to communication systems, and more particularly to a method and apparatus for synchronizing clock signals of a pair of separate communication systems sharing a common digital communication channel.

In order to synchronize operation of a pair of communication systems exchanging digital signals (e.g., PCM voice and data), master clock circuits of the systems are required to be synchronized in both phase and frequency for ensuring the integrity of the digital signal transmission.

In the event the systems are out of synchronization, PCM signals transmitted therebetween typically suffer distortion as a result of occasional bit slippage due to the clocks being out of phase, and the data signal transmission typically suffers from bit errors, requiring retransmission.

While PCM signal distortion is irritating but tolerable, data retransmission is a serious problem necessitating the use of extensive error detecting and correcting circuitry as well as consuming large amounts of processor time and reducing the information flow rate.

DESCRIPTION OF THE RELATED ART

A typical prior art system utilized a sophisticated phase-locked loop for synchronizing a local clock signal with a received remote clock signal. The phase-locked loop typically incorporated discrete components such as operational amplifiers and capacitors for establishing loop filter circuits. Such discrete components typically occupied considerable circuit board area, and exhibited low tolerance performance due to temperature induced drift, stray capacitance, etc. Also, expensive low drift oscillators were required to accumulate a significant enough phase error from which a phase correction signal could be derived for adjusting the phase of the oscillator. Such high accuracy oscillators typically also consumed a large amount of power and were expensive.

SUMMARY OF THE INVENTION

According to the present invention, a phase difference counter is utilized for detecting the phase error between a local clock signal and a received remote clock signal. A correction algorithm is implemented for generating a correction signal proportional to the detected phase error. The generated correction signal is applied to a control voltage input of the local clock oscillator for adjusting the frequency thereof and thereby reducing the phase error eventually to zero.

According to a preferred embodiment of the present invention, a programmable device is utilized for selecting one of a plurality of remote clock signal sources, modifying the selected clock signal and generating an appropriate frequency divided remote clock signal in response thereto. The local clock signal is also frequency divided via a counter, and the frequency divided local and remote clock signals are applied to a further counter for generating the aforementioned phase error signal.

A microprocessor performs a table look-up for retrieving an appropriate digital correction signal in response to receiving the generated phase error signal. The table is preferably graded such that a large phase error produces a large correction signal, while a small phase error produces a proportionately smaller correction signal. The generated correction signal is applied to a digital-to-analog converter for generating an analog control voltage signal in response thereto. The generated analog signal is then applied to the control voltage input of the local clock oscillator, as described above, for completing a negative feedback loop.

BRIEF DESCRIPTION OF THE DRAWING

A better understanding of the present invention will be obtained with reference to the detailed description below in conjunction with the following drawing, in which.

DESCRIPTION OF THE PREFERRED EMBODIMENT

Figure 1:
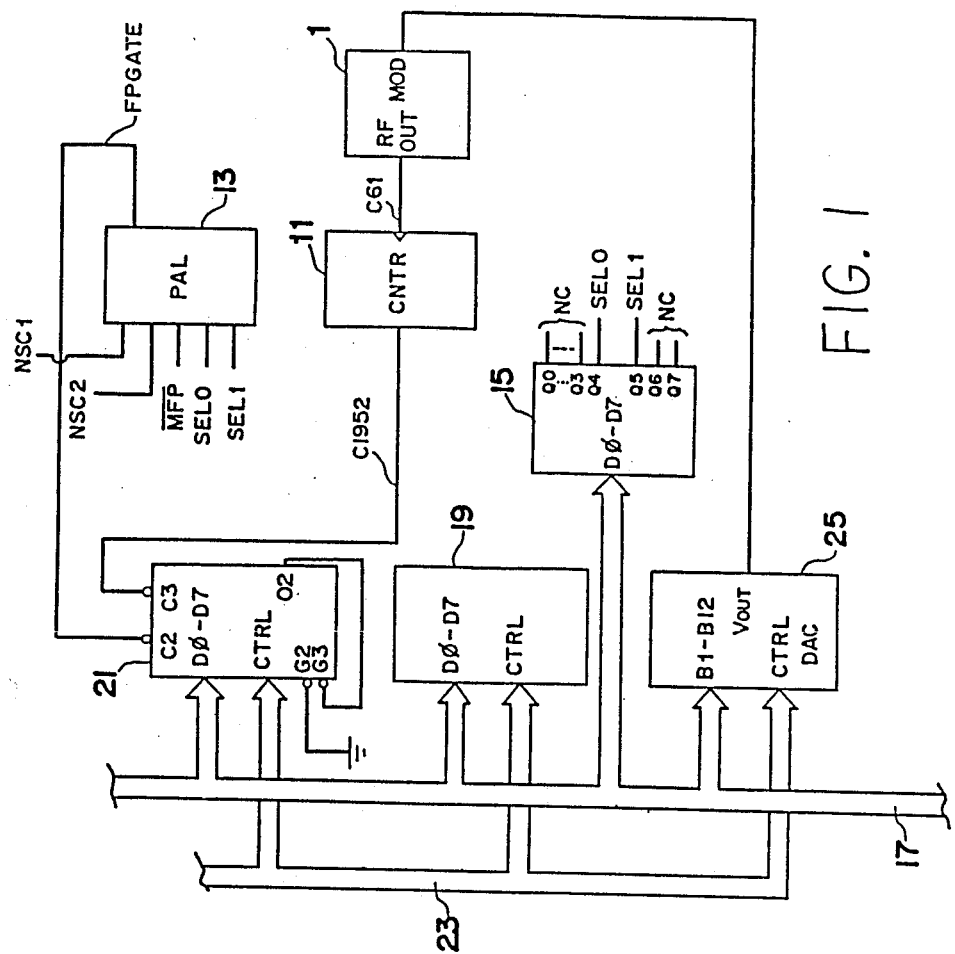
FIG. 1 is a schematic diagram of a circuit for synchronizing a pair of clock signals according to a preferred embodiment of the present invention.

With reference to FIG. 1 a voltage controlled oscillator 1 functions as a local clock oscillator and has a voltage control input MOD thereof for receiving an analog control voltage for controlling the frequency thereof. The oscillator 1 generates an approximately 16 megahertz 50% duty cycle local clock signal, designated as C61, from the $RF_{OUT}$ terminal thereof.

The C61 signal is applied to a clock input of a digital counter 11. Counter 11 typically generates a plurality of reference clock signals for controlling timing of various additional circuits (not shown) of the communication system. Of the generated clock signals, one is designated as C1952, which is an approximately 512 kilohertz phase increment signal.

A programmable logic device 13 such as the PAL ® programmable array logic device manufactured by Monolithic Memories Inc., has a first input thereof connected to a first source of remote clock signal NSC 1, a second input connected to a further source of remote clock signal NSC 2 and a third input connected to a mate plane of the communication system for generating a mate frame pulse signal $\overline{\text{MFP}}$. The mate plane is connected to a redundant controller (not shown). The PAL ® device 13 selects one of the three input signals in response to predetermined select signals SEL 0 and SEL 1 applied to the fourth and fifth inputs thereof from a central processor 19, such as the MC 68020 microprocessor, manufactured by Motorola Inc.

Processor 19 generates predetermined data signals for application to a data bus 17 and therefrom to a control register 15. The Q4 and Q5 outputs of control register 15 carry the aforementioned SEL 0 and SEL 1 select signals for application to PAL ® device 13, and the Q0–Q3, Q6 and Q7 outputs thereof are connected to additional circuitry (not shown).

In response to receiving the predetermined data signals from data bus 17, the Q4 and Q5 outputs of control register 15 generate one of four possible combinations for selecting one of the three input clock signals applied to PAL ® device 13, or none of the sources. In particular, in the event SEL 0 and SEL 1 are both at logic low levels, no source is selected (i.e., the synchronization function is disabled and the local communication system operates under control of the local clock signal alone); in the event the SEL 0 signal is at a logic high level and the SEL 1 is at a logic low level, the $\overline{\text{MFP}}$ source is selected. In the event the SEL 0 signal is at a logic low level and the SEL 1 signal is at a logic high level the NSC 1 source is selected, and in the event both of the SEL 0 and SEL 1 are at logic high levels the NSC 2 source is selected.

Each of the signal sources applied to PAL ® device 13 is comprised of a nominal 8 kilohertz clock signal which can be in the form of a pulse, square or variable duty cycle signal. In response to receiving the selected one of the source signals, PAL ® device 13 generates a squarewave signal of one half the input signal frequency (i.e. 4 kilohertz), denoted as FPGATE.

In particular, PAL ® device 13 is programmed according to the following code for generating the FPGATE signal:

| IF(/PUP)FPGATE | =/SEL1*SEL0*/FPG1*/MFP ; | mate frame pulse |
|---|---|---|
| | +/SEL1*SEL0*FPGATE*MFP | |
| | + SEL1*/SEL0*/FPG1*/NSC1; | netsync source 1 |
| | + SEL1*/SEL0*FPGATE*NSC1 | |
| | + SEL1*SEL0* /FGP1*/NSC2; | netsync source 2 |
| | + SEL1*SEL0*FPGATE*NSC2 | |
| | + FPGATE*/FPG1 | |
| IF(/PUP)FPG1 | =/SEL1* SEL0*MFP*FPGATE ; | mate frame pulse |
| | +/SEL1* SEL0*FPG1*/MFG | |
| | + SEL1*/SEL0*NSC1*FPGATE; | netsync source 1 |
| | + SEL1*/SEL0*FPG1*/NSC1 | |
| | + SEL1* SEL0*NSC2*FPGATE; | netsync source 2 |
| | + SEL1* SEL0*FPG1*/NSC2 | |
| | + FPG1* FPGATE | |

The FPGATE signal from PAL ® device 13 is applied to the C2 clock input of a further digital counter 21. Counter 21 is preferably a three part counter such as a 68B40 digital counter having an output of the second counter 02 connected to an enable input G3 of the third counter. The enable input of the second counter G2 is connected to ground, and the C3 clock input is connected to the output of counter 11 carrying the aforementioned C1952 phase increment signal. Output terminals D0-D7 of counter 21 are connected to data bus 17, and a control input CTRL is connected to a control bus 23 which typically carries decoded address signals, READ/WRITE signals etc., generated via a parallel CONTROL port output of microprocessor 19, in a well known manner. Counter 21 is cleared to a predefined state via the D0-D7 and CTRL inputs in response to microprocessor 19 executing an initialization subroutine.

The second counter of the three part counter 21 generates a logic low output signal on the 02 output thereof in response to receiving 1600 cycles of the FPGATE signal output from PAL ® device 13. In response, the third counter is enabled for counting the number of C1952 phase increment clock cycles received during a single half-cycle of the 02 output signal. Accordingly, the second counter of three part counter 21 receives the 4 kilohertz FPGATE signal, and in response generates an approximately 80 millisecond duration squarewave signal from the 02 output thereof. The 80 millisecond signal is applied to the G3 enable input for the third part of the counter which in turn counts the C1952 clock signal cycles. The third counter is initialized whenever the G3 input thereof goes to a logic low level. Consequently, the third counter accumulates a predetermined number of C1952 clock cycles during the logic low portion of the 800 millisecond enable signal (i.e. each 400 milliseconds).

In order to determine if the third counter of the three part counter 21 has finished counting, microprocessor 19 reads the value of a status register associated with the second counter every approximately 100 milliseconds. The data register of the third counter is then read twice by microprocessor 19 within an approximately 2 microsecond time frame, via the D0-D7 terminals and data bus 17. In the event the two values read by microprocessor 19 are not the same, then the counter 3 is still counting cycles of the C1952 clock signal, and in the event the two values are the same, then the read data corresponds to a measurement of the phase difference between the remote and local clock signals, denoted as the count value.

The instantaneous count value is successively (i.e., every 100 milliseconds) accumulated or summed in a short term accumulator register associated with the microprocessor.

This procedure is repeated until approximately 12.8 seconds have elapsed, at which time the value stored in a long term accumulator is added to the accumulated phase error or count value stored in the short term accumulator and the sum is stored in the long term accumulator. The value stored in the long term accumulator is designated LTA.

The microprocessor 19 then checks the value of the sampled phase errors in the long term accumulator, and in the event the value is outside a predetermined range, an acquisition algorithm is executed for recovering phase lock between the local and remote clock signals.

The acquisition algorithm determines the number of sample cycles required in order to provide phase lock. A 12-bit digital correction value is calculated by microprocessor 19, and is designated "Frequency Control Word" (FCW) where FCW equals FCW+(LTA×125)/16. The FCW value is then applied to the B1-B12 input of DAC 25 to adjust the frequency of local oscillator 1 in order to provide initial phase lock acquisition.

The standard tracking algorithm is executed only in the event the long term accumulator value (LTA) is found to be within the aforementioned predetermined range, or in the event the acquisition algorithm has been executed for approximately 64 seconds, in which case the microprocessor 19 assumes that phase lock has been established.

Unlike the acquisition algorithm, the tracking algorithm calculates an offset value to be added to the frequency control word (FCW) in the manner of fine tuning of the local clock signal frequency.

In particular, a variable designated as integrated sum (IS) is accumulated in a further data register associated with microprocessor 19, wherein IS=IS+(-LTA×256). In the event IS is greater than a predetermined maximum value, then the frequency control word FCW is made equal to the maximum value (FFF hexadecimal) of the control word written to DAC 25. In the event IS is less than a predetermined minimum value, the frequency control word FCW is made equal to a minimum DAC value of 0 hexadecimal.

Otherwise, the value of the frequency control word FCW is calculated by microprocessor 19 as follows:

$$FCW = \frac{(IS + (IS + (LTA \times 256)) + (LTA \times 256 \times 512))}{65536}$$

In the event the frequency control word (FCW) is greater than the maximum value that can be applied to DAC 25, then the frequency control word assumes the maximum DAC value of FFF hex, and in the event the frequency control word is less than the minimum value which can be applied to the DAC 25, then the frequency control word assumes the value of 0.

The generated 12-bit correction signal is applied via data bus 17 to the B1–B12 terminals of a 12-bit digital-to-analog converter DAC 25, and the long term accumulator (LTA) contents are cleared. DAC 25 has a control input CTRL thereof connected to the control bus 23 in a well known manner. An analog voltage output VOUT of DAC 25 is connected to the control voltage input MOD of oscillator 1 for controlling the frequency thereof in response to the detected phase error.

A further subroutine is performed for checking the frequency control word FCW every 12.8 seconds. A maximum and minimum control range for the frequency control word is updated according to this subroutine in order that the frequency control word is maintained within reasonable limits.

The synchronization process can be masked in the event the local oscillator 1 is used as a master oscillator without requiring synchronization to any external source.

In the event successive readings of the third counter of the three part counter 21 result in a phase error which is outside the aforementioned predetermined range, a massive phase change is detected and an internal flag of microprocessor 19 is set, and one or more predetermined "check fault" and "classify fault" subroutines are implemented for scanning the third to the fifth readings of the third counter of counter 21 for ten successive phase readings from the time that the massive phase change is detected.

Such a massive phase change can be, for instance, the result of a single hit on the remote incoming clock signal line, a simple phase shift fault, or an unstable synchronization process.

A further variable denoted LAST STABLE PHASE is utilized by microprocessor 19 when the algorithm detects a massive phase change. In this case, the last stable phase is recorded before the massive change in order to detect single hit faults. Also, an UNSTABLE PHASE variable is maintained to record the phase error reading that causes the interface to detect that there has been a massive phase change.

In the event that an out of range phase reading is obtained, an unstable phase error is considered to have been detected. According to the "check fault" and "classify fault" subroutines, the phase error is calculated by determining the absolute value of the difference between the current phase error and the LAST STABLE or UNSTABLE PHASE values, and a message is sent to the main controller (not shown) for causing implementation of a correction or acquisition algorithm.

The microprocessor 19 also monitors for incoming messages from the main controller for enabling synchronization, disabling synchronization, requesting for presence of status content or control range report, etc.

In the event the remote signal source drops out or becomes noisy, the phase error averages out over approximately 12.8 seconds, and microprocessor 19 executes a maintenance subroutine for monitoring the source of remote signal. For instance, the NSC 1 and NSC 2 remote signal sources can be digital service unit cards incorporating T1 receivers such that two T1 trunks can be utilized accommodating up to four possible network sources In the event that the connected trunk (e.g. NSC 1) is noisy or drops out completely, microprocessor 19 then switches control via PAL ® device 13 to the secondary source, (NSC 2).

In the event a new synchronization source is selected, or the synchronization source drops out, the phase count for the first timing period may be erroneous, but will be corrected during the second timing period.

In summary, a phase accumulating counter is utilized to synchronize a local voltage controlled oscillator clock with a remote clock signal received and modified via a programmable logic device, such as the PAL ® device 13. The counter is run with microprocessor software to generate a count value or phase reading for use in connection with the microprocessor algorithm to adjust the voltage controlled oscillator via an analog-to-digital converter. The clock signals are thus frequency aligned and thereafter phase aligned without requiring complex analog circuitry as in the prior art.

A person understanding the present invention may conceive of other embodiments or variations thereof. For example, while the system described herein refers only to communication systems, the principles may be applied to synchronizing a data subscriber set with a communication system, or a pair of data sets to each other. Also, a multiplicity of systems may be synchronized together by synchronizing respective ones of the various locally generated clock signals with successive ones of the remote generated clock signals. In addition, the PAL ® device 13 may be replaced by standard logic circuitry or a programmable logic array (PLA) for converting the variable duty cycle input signal to a 50% duty cycle one-half frequency signal.

All such embodiments or variations are considered to be within the sphere and scope of the present invention as defined by the claims appended hereto.

We claim:

1. Apparatus for synchronizing a local clock signal with a remote clock signal, comprised of:
   (a) a voltage controlled master oscillator for generating a master oscillator signal, and a digital counter for receiving and frequency dividing said master oscillator signal and in response generating a phase increment signal having a frequency which is a multiple of the local clock signal frequency such that a predetermined number of phase increment signal cycles are generated during each local clock signal cycle,
   (b) a programmable logic device for receiving a plurality of clock signals from external sources and in response generating said remote clock signal derived from a predetermined selected one of said plurality of clock signals, (c) means for receiving said remote and phase increment signals and generating a count value corresponding to the number of cycles of said phase increment signal received during each received cycle of said remote clock signal, (d) means for receiving said count value and decreasing said local clock signal frequency in the event said count value is greater than said predetermined number of phase increment signal cycles, and increasing said local clock signal frequency in the event said count value is lower than said predetermined number of cycles, thereby synchronizing said local clock signal with said remote clock signal in both phase and frequency, said means for receiving said count value being further comprised of:

(e) a microprocessor for comparing said count value with a predetermined acceptable range of stored values and generating a digital correction signal in response thereto, said correction signal being graded such that a large phase error produces a large amplitude correction signal while a small phase error produces a proportionately smaller amplitude correction signal, (f) a digital-to-analog converter for receiving said digital correction signal and in response generating an analog control voltage signal, and (g) said voltage controlled master oscillator for receiving said control voltage signal and in response generating said master oscillator signal having frequency proportional to the magnitude of said control voltage signal.

2. Apparatus as defined in claim 1, wherein said means for receiving said remote and phase increment signals and generating said count value is comprised of a further digital counter.

3. Apparatus as defined in claim 1, wherein said means for receiving said remote and phase increment signals and generating said count value is comprised of a further digital counter.

4. Apparatus as defined in claim 1, wherein said means for receiving said remote and phase increment signals and generating said count value is comprised of a further digital counter.

5. Apparatus as defined in claim 1, wherein said means for receiving said count value is comprised of:

(a) a microprocessor for comparing said count value with a predetermined acceptable range of stored values and generating a digital correction signal in response thereto, (b) a digital-to-analog converter for receiving said digital correction signal and in response generating an analog control voltage signal, and (c) a voltage controlled oscillator for receiving said control voltage signal and in response generating said master oscillator signal having frequency proportional to the magnitude of said control voltage signal.

6. Apparatus as defined in claim 1, wherein said correction value is designated FCW and is calculated according to the following formula:

$$FCW = \frac{(IS + (IS + (LTA \times 256)) + (LTA \times 256 \times 512))}{65536}$$

where

LTA = sum of count of said number of cycles of said phase increment signal calculated over a period of approximately 12.8 seconds, and

IS = IS + LTA × 256.

7. Apparatus for synchronizing a pair of clock signals, comprised of:

(a) means for receiving and selecting a predetermined remote clock signal from a plurality of remote clock signal sources and in response generating a frequency divided clock signal derived from said predetermined remote clock signal, (b) voltage controlled master oscillator means for generating a master oscillator signal, (c) means for receiving said master oscillator signal and generating a frequency divided phase increment signal in response thereto, (d) means for receiving said frequency divided clock signal and phase increment signal and in response generating a count value corresponding to the number of phase increment signal cycles received during each received frequency divided clock signal cycle, (e) means for receiving said count value and generating a predetermined digital correction value in response thereto, and (f) means for receiving said digital correction value and in response generating an analog control voltage signal for application to a voltage control input of said voltage controlled master oscillator means for controlling the frequency of said master oscillator signal and thereby synchronizing said master oscillator signal with said predetermined remote clock signal.

8. Apparatus as defined in claim 7, wherein said means for receiving and selecting is comprised of a programmable logic device.

9. Apparatus as defined in claim 7, wherein said means for receiving said master oscillator signal and generating a frequency divided phase increment signal is comprised of a digital counter circuit.

10. Apparatus as defined in claim 7, wherein said means for receiving said frequency divided clock signal and phase increment signal is comprised of a digital counter for counting the number of cycles of said phase increment signal in response to being enabled by said frequency divided clock signal.

11. Apparatus as defined in claim 7, wherein said means for receiving said count value and generating a digital correction value is comprised of a microprocessor for implementing a tracking algorithm which detects whether said count value is within a predetermined range and if so calculates said correction value for maintaining synchronization, based on said count value, and if said count value is not within said predetermined range said microprocessor implements an acquisition algorithm for re-obtaining phase lock between said remote and local clock signals.

12. Apparatus as defined in claim 7, wherein said means for receiving said digital correction value and generating said analog control voltage signal is comprised of a digital-to-analog converter.

13. Apparatus as defined in claim 11, wherein said digital correction value is designated FCW and is calculated according to the following formula:

$$FCW = \frac{(IS + (IS + (LTA \times 256)) + (LTA \times 256 \times 512))}{65536}$$

where

LTA = sum of count of said number of cycles of said phase increment signal calculated over a period of approximately 12.8 seconds, and

IS = IS + LTA × 256.

14. Apparatus as defined in claim 8, wherein said programmable logic device is comprised of a PAL® device.

15. Apparatus as defined in claim 8, wherein said means for receiving said master oscillator signal and generating a frequency divided phase increment signal is comprised of a digital counter circuit.

16. Apparatus as defined in claim 14, wherein said means for receiving said master oscillator signal and generating a frequency divided phase increment signal is comprised of a digital counter circuit.

17. Apparatus as defined in claim 8, wherein said means for receiving said frequency divided clock signal and phase increment signal is comprised of a digital counter for counting the number of cycles of said phase increment signal in response to being enabled by said frequency divided clock signal.

18. Apparatus as defined in claim 8, wherein said means for receiving said digital correction value and generating said analog control voltage signal is comprised of a digital-to-analog converter.

* * * * *

UNITED STATES PATENT AND TRADEMARK OFFICE
CERTIFICATE OF CORRECTION

PATENT NO. : 4,843,617
DATED : June 27, 1989
INVENTOR(S) : Scott Marshall et. al It is certified that error appears in the above-identified patent and that said Letters Patent is hereby corrected as shown below:

Column 3, line 20, change "FGP1" to --- FPG1 ---;

line 24, change "MFG" to --- MFP ---;

line 57, change "80" to --- 800 ---;

line 58, change "80" to --- 800 ---.

Signed and Sealed this

Sixteenth Day of April, 1991

Attest:

HARRY F. MANBECK, JR.

*Attesting Officer*   *Commissioner of Patents and Trademarks*